(12) United States Patent
Ren

(10) Patent No.: US 8,130,999 B2
(45) Date of Patent: Mar. 6, 2012

(54) COVER ASSEMBLY

(75) Inventor: Xue-Jie Ren, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 532 days.

(21) Appl. No.: 12/391,346

(22) Filed: Feb. 24, 2009

(65) Prior Publication Data
US 2010/0128419 A1     May 27, 2010

(30) Foreign Application Priority Data

Nov. 21, 2008  (CN) .......................... 2008 1 0305696

(51) Int. Cl.
*H05K 5/00* (2006.01)
(52) U.S. Cl. ................................. 381/391; 361/679.01
(58) Field of Classification Search .................. 361/379, 361/679, 679.01; 343/702, 873; 348/790–838; 381/384, 74, 391; 455/557, 41.2, 575.2; 439/142
See application file for complete search history.

*Primary Examiner* — Jarrett J Stark
*Assistant Examiner* — Lawrence Tynes, Jr.
(74) *Attorney, Agent, or Firm* — Altis Law Group, Inc.

(57) ABSTRACT

A cover assembly used in a portable electronic device is described. The cover assembly includes a body member defining a hole and a cover member defining at least one latching block. The hole is surrounded by an inner peripheral wall. The inner peripheral wall is defined at least one L-shaped slot. The latching block is releasably received in the L-shaped slot, while the cover member cover is rotatably connected to the body member to expose or close off the hole.

12 Claims, 5 Drawing Sheets

COVER ASSEMBLY

BACKGROUND

1. Field of the Invention

The present disclosure relates to a cover assembly and, particularly, to a cover assembly for covering an earphone hole of a portable electronic device.

2. Description of Related Art

Portable electronic devices (e.g., mobile phones) usually have earphone holes for insertion of earphones. Covers are required to cover and protect the earphone hole from e.g., water and dust.

A typical earphone cover is often made of rubber and is fixedly connected to the mobile phone by a flexible strip. The flexible strip can be bent to facilitate covering/exposing of the earphone hole.

However, the flexible strip may not endure frequent bending and can be easily broken.

Therefore, there is room for improvement within the art.

BRIEF DESCRIPTION OF THE DRAWINGS

Many aspects of the cover assembly for earphone hole can be better understood with reference to the following drawings. These drawings are not necessarily drawn to scale, the emphasis instead being placed upon clearly illustrating the principles of the present cover assembly for earphone hole. Moreover, in the drawings like reference numerals designate corresponding members throughout the several views.

DETAILED DESCRIPTION OF EXEMPLARY EMBODIMENT

Figure 1:
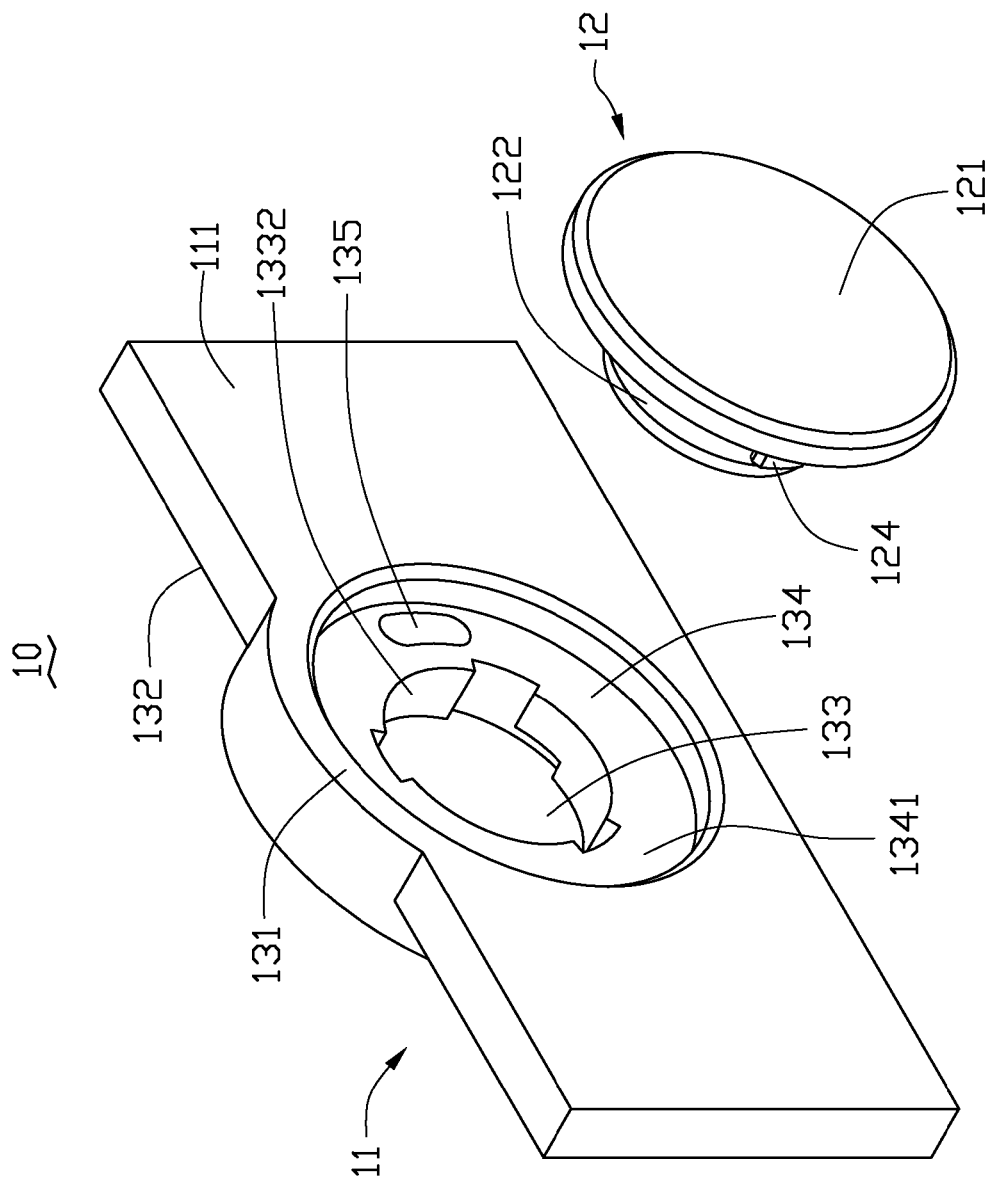
FIG. 1 is an exploded, isometric view of a cover assembly for earphone hole, in accordance with an exemplary embodiment.
Figure 2:
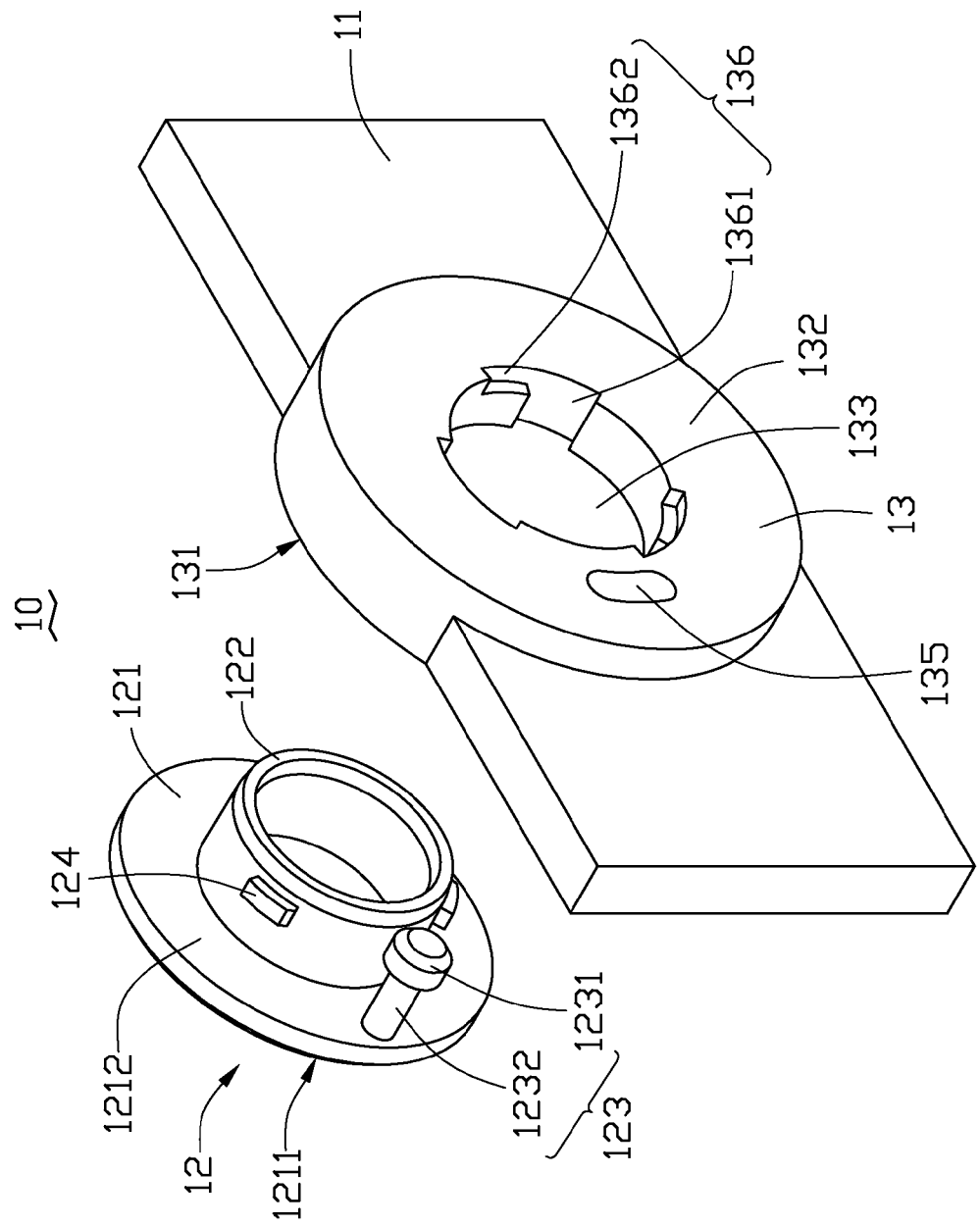
FIG. 2 is another isometric view of the cover assembly for earphone hole shown in FIG. 1.
Figure 3:
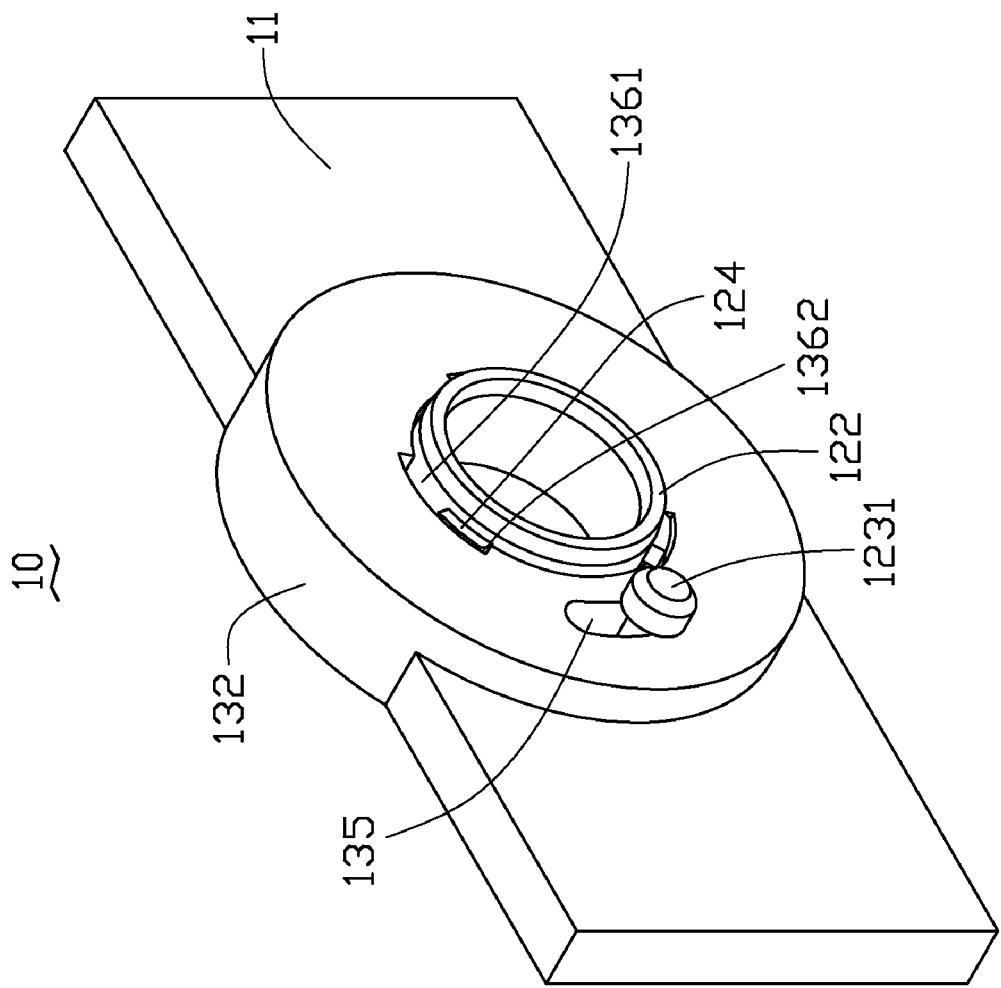
FIG. 3 is an assembly view of the cover assembly for earphone hole shown in FIG. 1.

FIGS. 1 through 3 show an exemplary cover assembly 10 used in a portable electronic device (e.g., mobile phone). The cover assembly 10 includes a body member 11 and a cover member 12. The cover member 12 is rotatably connected to the body member 11.

The body member 11 can be a portion of a housing of the portable electronic device. The body member 11 includes a wall 111. The wall 111 defines a round mounting portion 13 at a center. The mounting portion 13 includes an exterior surface 131 and an opposite interior surface 132. The exterior surface 131 of the mounting portion 13 is recessed to define a cavity 134 with a bottom wall 1341. The bottom wall 1341 defines an earphone hole 133 communicating with the interior surface 132. The bottom wall 1341 of the cavity 134 defines a through hole 135 communicating with the interior surface 132 adjacent to the earphone hole 133. The through hole 135 is defined along the peripheral direction of the bottom wall 1341. The earphone hole 133 is surrounded by an inner peripheral wall 1332. The inner peripheral wall 1332 defines three symmetrical L-shaped slots 136. Each L-shaped slot 136 includes a first slot section 1361 and a second slot section 1362 communicating with the first slot section 1361. The first slot section 1361 is defined along a central axis of the earphone hole 133. The second slot section 1362 is defined along a peripheral direction of the earphone hole 133 and adjacent to the interior surface 132.

The cover member 12 has a T-shaped cross-section, including a flange portion 121 and a body portion 122. The flange portion 121 is configured to be received in the cavity 134 to cover the earphone hole 133. The flange portion 121 includes an outer surface 1211 and an opposite inner surface 1212. The body portion 122 protrudes from a center of the inner surface 1212. An elastic latch portion 123 protrudes from the inner surface 1212 adjacent to the body portion 122. The latch portion 123 may be made of rubber, including a head portion 1231 and a connecting portion 1232. The connecting portion 1232 is configured to be received in the through hole 135. The head portion 1231 has elastic characteristic and can be deformed to be secured in the through hole 135. Three rectangular latching blocks 124 respectively protrude from a peripheral wall of the body portion 122, corresponding to the three L-shaped slots 136. Each latching block 124 is configured to slide along the first slot section 1361 and then be locked into the second slot section 1362.

In assembly, the body portion 122 is inserted into the earphone hole 133. The latch portion 123 is inserted into the through hole 135, and the head portion 1231 inserts and passes the through hole 135 by deformation and the connecting portion 1232 is movably received in the through hole 135. At this time, each latching block 124 slides into a corresponding first slot section 1361. Then the cover member 12 is further pushed towards the body member 11 and rotated until the latching blocks 124 are locked into the second slot sections 1362. Thus, the assembly process of the cover assembly 10 is finished. At this time, the earphone hole 131 is closed off by the flange portion 121 of the cover member 12.

Figure 4:
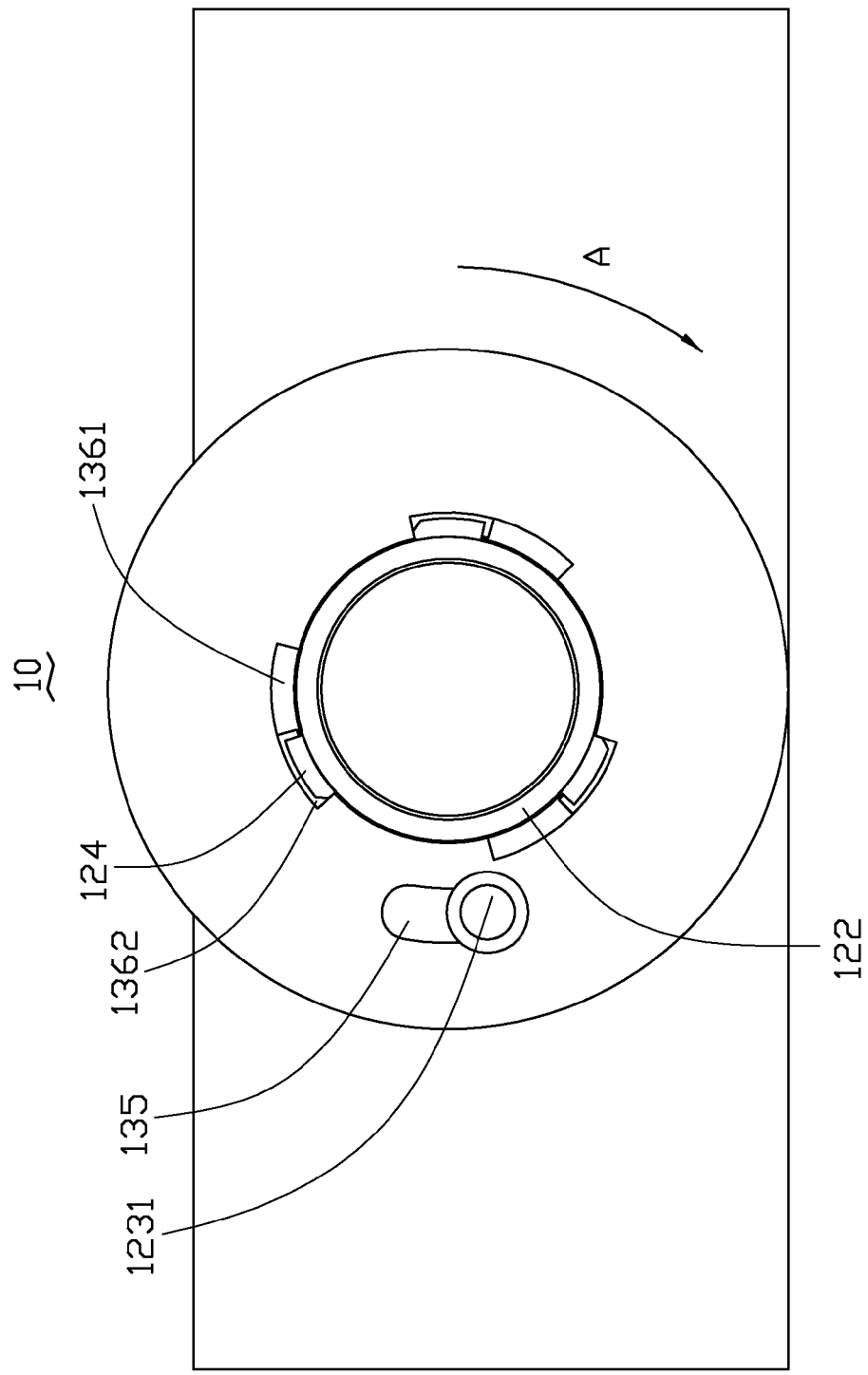
FIG. 4 is a first position of the cover assembly for earphone hole shown in FIG. 3, corresponding to an opening/closing position of the cover assembly.
Figure 5:
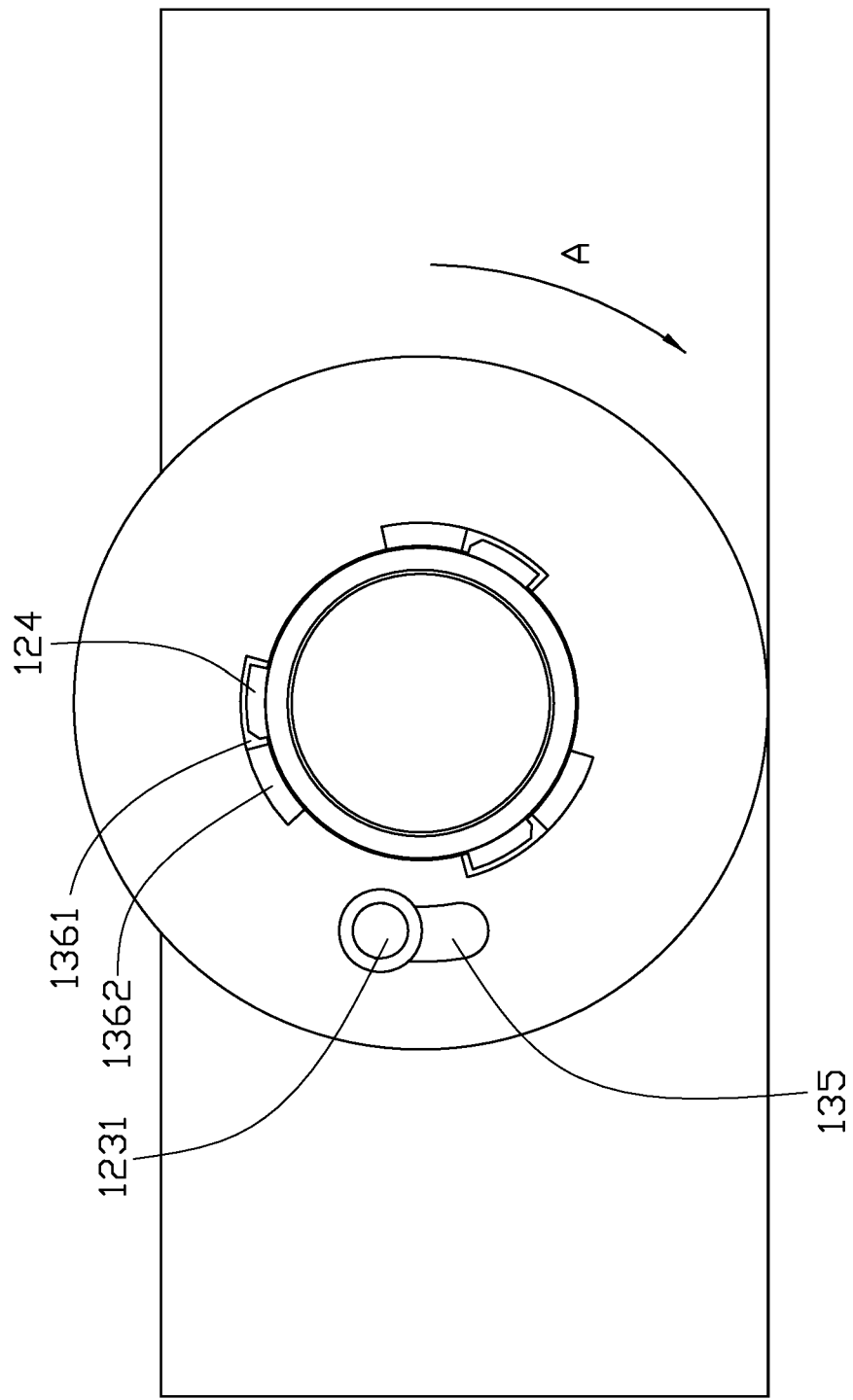
FIG. 5 is a second position of the cover assembly for earphone hole shown in FIG. 3, corresponding to an opening/closing position of the cover assembly.

FIGS. 4 and 5 show the cover member 12 moving from the above-described position (i.e., closed position) to an opened position. In use, the cover member 12 is rotated along arrow A until the latching blocks 124 slide from the second slot sections 1362 into the first slot sections 1361. Then, the cover member 12 is pulled away from the body member 11 along the first slot sections 1361 until the cover member 12 is completely detached from the cavity 134. At this time, the connecting portion 1232 is still received in the through hole 135 and the head portion 1231 abuts against the interior surface 132 of the mounting portion 13. Then the flange portion 121 can be rotated about the latch portion 123 to expose the earphone hole 133.

In alternative embodiments, there can be any number of L-shaped slots 136 and corresponding latching blocks 124.

The cover member 12 can be rotated relative to the body member 11 to expose or close off the earphone hole 133, avoiding the distortion of the flexible strip, and prolonging life-span of the cover assembly 10.

It is to be understood, however, that even through numerous characteristics and advantages of the present invention have been set forth in the foregoing description, together with details of the structure and function of the invention, the disclosure is illustrative only, and changes may be made in detail, especially in matters of shape, size, and arrangement of members within the principles of the invention to the full extent indicated by the broad general meaning of the terms, in which the appended claims are expressed.

What is claimed is:

1. A cover assembly, comprising:
a body member defining a hole, the hole being surrounded by an inner peripheral wall, the inner peripheral wall defining at least one L-shaped slot; and
a cover member defining at least one latching block, the latching block being releasably received in the L-shaped slot, the cover member cover being rotatably connected to the body member to expose or close off the hole.

2. The cover assembly as claimed in claim 1, wherein the L-shaped slot includes a first slot section and a second slot section communicating with the first slot section, the first slot section is defined along a central axis direction of the hole, the second slot section is defined along a peripheral direction of the hole and adjacent to an interior wall of the body member.

3. The cover assembly as claimed in claim 1, wherein the cover member includes a flange portion and a body portion, the latching block protrudes from the body portion, the body portion is received in the hole.

4. The cover assembly as claimed in claim 3, wherein the body member is recessed to define a cavity with a bottom wall, the bottom wall defines the hole, the flange portion is received in the cavity.

5. The cover assembly as claimed in claim 3, wherein the flange portion includes an outer surface and an opposite inner surface, the body portion protrudes from a center of the inner surface, an elastic latch portion protrudes from the inner surface adjacent to the body portion, the body member defines a through hole communicating with an interior wall of the body member, the latch portion latches into the through hole.

6. The cover assembly as claimed in claim 5, wherein the latch portion includes a head portion and a connecting portion, the connecting portion is configured to be received in the through hole, the head portion being deformed to be secured inside the body member through the through hole.

7. A cover assembly, comprising:
a body member defining an earphone hole, the earphone hole being surrounded by an inner peripheral wall, the inner peripheral wall defining at least one L-shaped slot; and
a cover member defining at least one latching block, the latching block being releasably received in the L-shaped slot, the cover member cover being rotatably connected to the body member to expose or close off the earphone hole.

8. The cover assembly as claimed in claim 7, wherein the L-shaped slot includes a first slot section and a second slot section communicating with the first slot section, the first slot section is defined along a central axis direction of the earphone hole, the second slot section is defined along a peripheral direction of the earphone hole and adjacent to an interior wall of the body member.

9. The cover assembly as claimed in claim 7, wherein the cover member includes a flange portion and a body portion, the latching block protrudes from the body portion, the body portion is received in the earphone hole.

10. The cover assembly as claimed in claim 9, wherein the body member is recessed to define a cavity with a bottom wall, the bottom wall defines the earphone hole, the flange portion is received in the cavity.

11. The cover assembly as claimed in claim 9, wherein the flange portion includes an outer surface and an opposite inner surface, the body portion protrudes from a center of the inner surface, an elastic latch portion protrudes from the inner surface adjacent to the body portion, the body member defines a through hole communicating with an interior wall of the body member, the latch portion latches into the through hole.

12. The cover assembly as claimed in claim 11, wherein the latch portion includes a head portion and a connecting portion, the connecting portion is configured to be received in the through hole, the head portion being deformed to be secured inside the body member through the through hole.

* * * * *